United States Patent [19]

Kolodny et al.

[11] Patent Number: 4,785,199
[45] Date of Patent: * Nov. 15, 1988

[54] PROGRAMMABLE COMPLEMENTARY TRANSISTORS

[75] Inventors: Avinoam Kolodny, Cupertino; Yigal Brandman, Stanford, both of Calif.

[73] Assignee: Stanford University, Stanford, Calif.

[*] Notice: The portion of the term of this patent subsequent to Sep. 2, 2003 has been disclaimed.

[21] Appl. No.: 910,322

[22] Filed: Sep. 22, 1986

Related U.S. Application Data

[62] Division of Ser. No. 555,898, Nov. 28, 1983.

[51] Int. Cl.$^4$ .................. H03K 19/02; H03K 19/094; H03K 19/173; H03K 19/20
[52] U.S. Cl. .................. 307/202.1; 307/451; 307/469
[58] Field of Search ........... 307/202.1, 450, 451, 307/469, 465, 468

[56] References Cited

U.S. PATENT DOCUMENTS

| | | | |
|---|---|---|---|
| 4,016,588 | 4/1977 | Ohya et al. | 357/23.5 X |
| 4,148,044 | 4/1979 | Roessler | 357/23.5 |
| 4,228,527 | 10/1980 | Gerber et al. | 365/181 X |
| 4,302,766 | 11/1951 | Guterman et al. | 357/23.5 X |
| 4,402,064 | 8/1983 | Arakawa | 357/23.5 X |
| 4,609,830 | 9/1986 | Brandman | 307/202.1 |

FOREIGN PATENT DOCUMENTS

| | | | |
|---|---|---|---|
| 0103043 | 3/1984 | European Pat. Off. | 365/181 |
| 0057882 | 5/1979 | Japan | 357/23 |
| 54-78679 | 6/1979 | Japan | 357/42 |
| 0399916 | 11/1974 | U.S.S.R. | 357/42 |

Primary Examiner—Stanley D. Miller
Assistant Examiner—Timothy P. Callahan
Attorney, Agent, or Firm—Flehr, Hohbach, Test, Albritton & Herbert

[57] ABSTRACT

Programmable logic gate structures employ pairs of complementary transistors. Programming of the transistors is accomplished either by voltage biasing a shared floating gate of a CMOS transistor pair or by providing a variable resistance serially or in parallel with each transistor. The variable resistance can be a fusible link or a semiconductor device having an alterable crystalline structure.

3 Claims, 4 Drawing Sheets

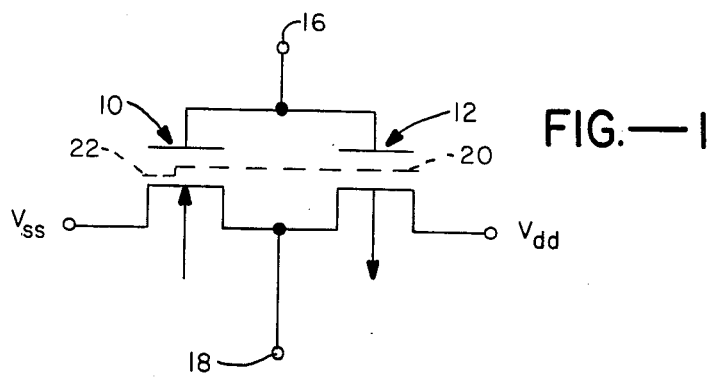
FIG.—1
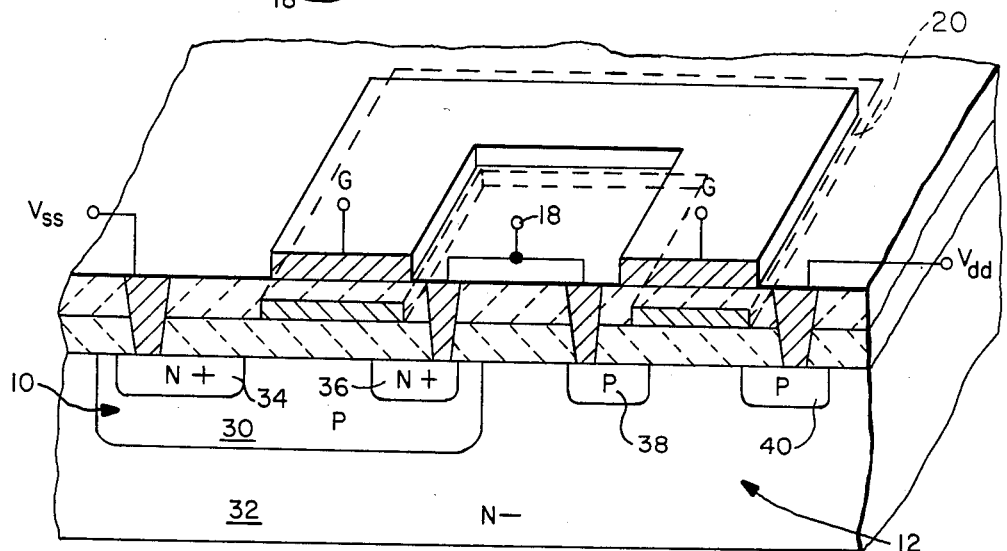
FIG.—2
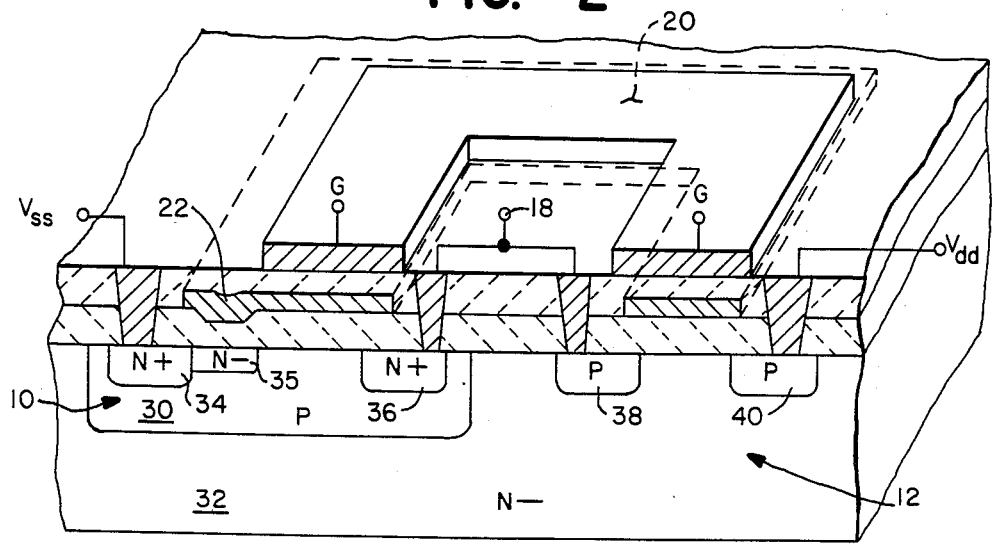
FIG.—3

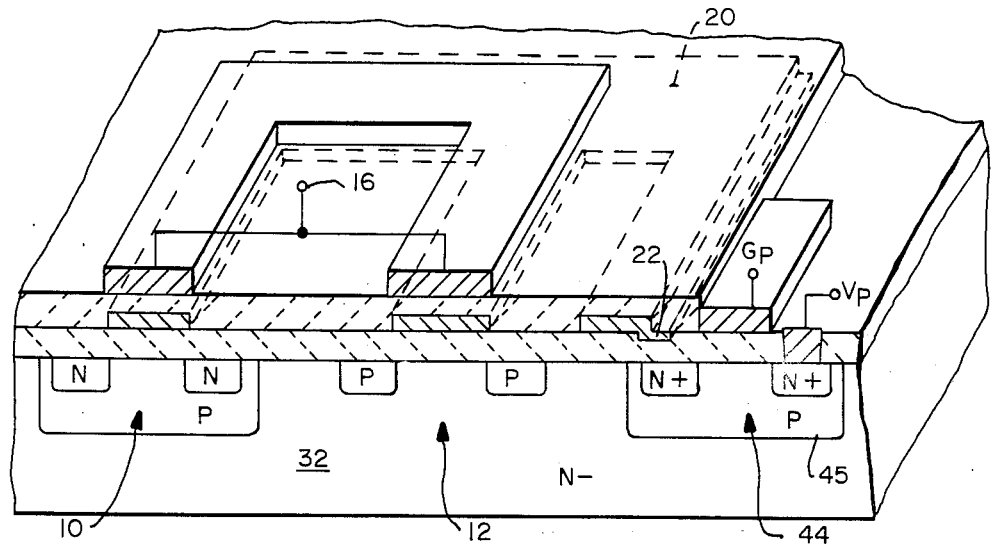
FIG.—4A
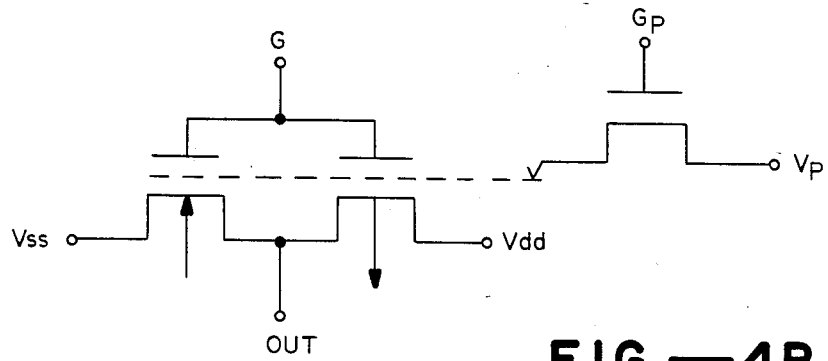
FIG.—4B
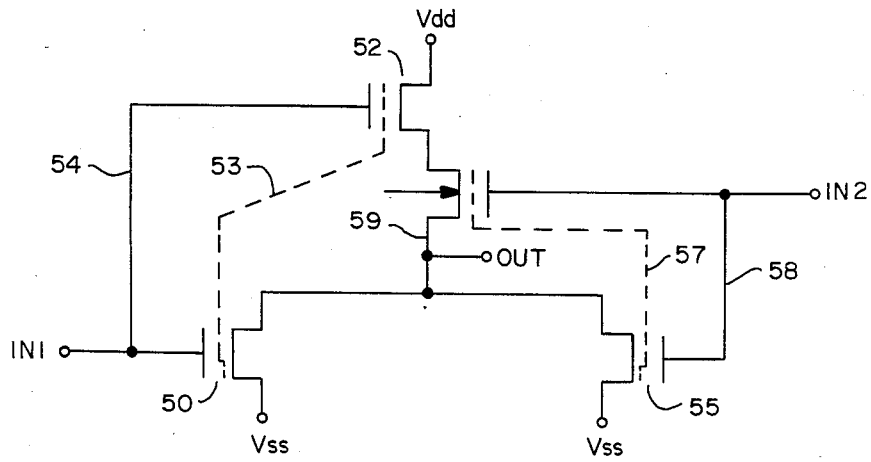
FIG.—5

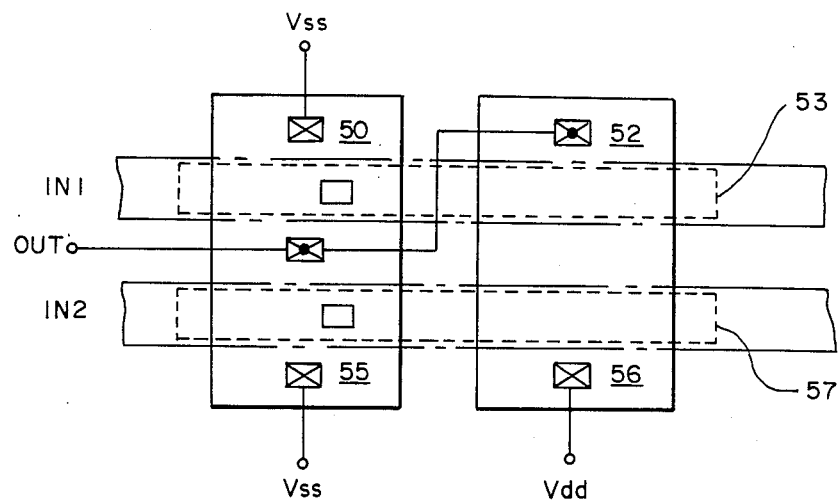
FIG.—6
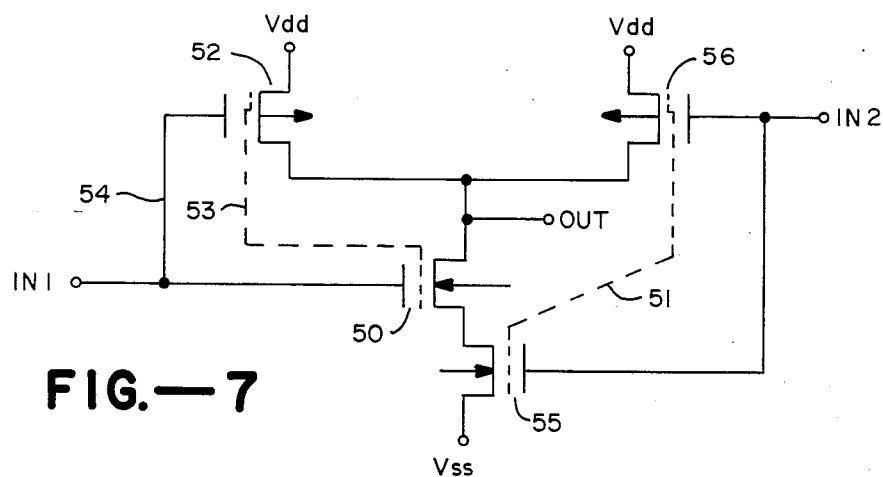
FIG.—7
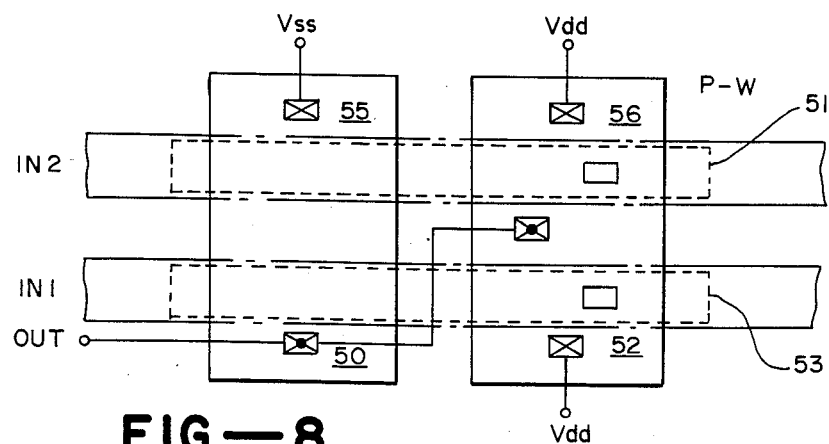
FIG.—8

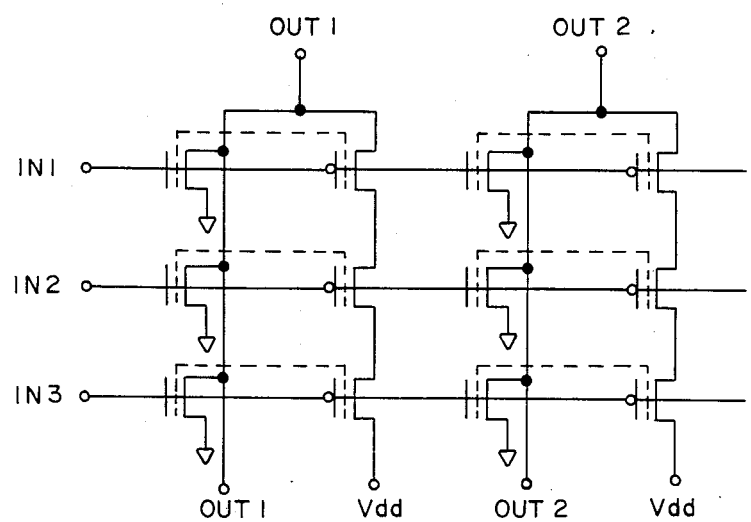
FIG.—9
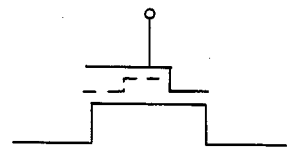
FIG.—10A
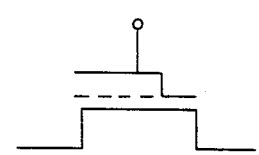
FIG.—10B
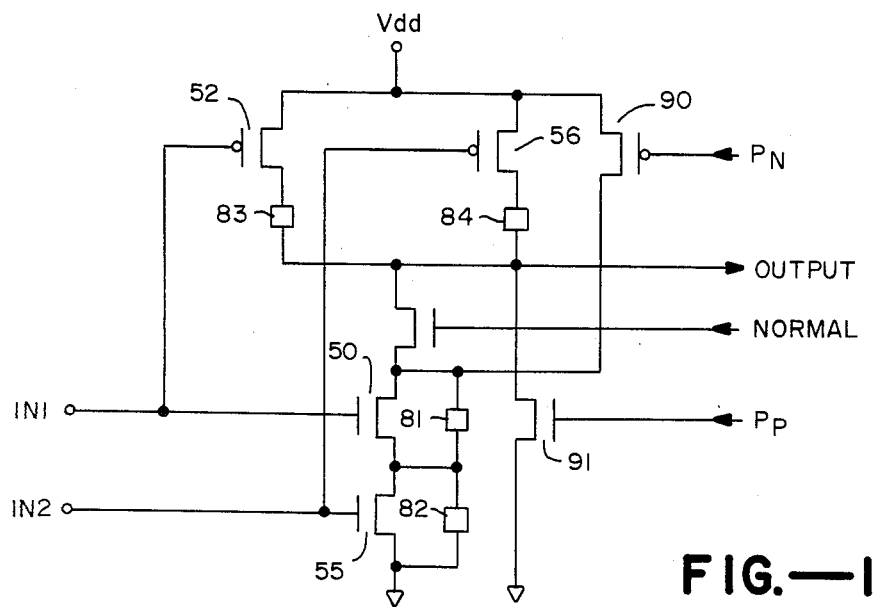
FIG.—11

PROGRAMMABLE COMPLEMENTARY TRANSISTORS

This is a division of application Ser. No. 555,898 filed Nov. 28, 1983.

This invention relates generally to semiconductor devices and technology, and more particularly the invention relates to programmable complementary transistors and logic gate structures.

The ability to program elements in a semiconductor integrated circuit, after fabrication thereof, is desirable in many applications including programmable memories, logic arrays, linear circuits, discretionary wiring in large integrated circuit arrays, and the like.

The electrically programmable (EPROM) and electrically eraseable (E2PROM) memories employ MOS transistors having floating gates which can be selectively charged to establish conductivity threshold levels of the individual transistors. See for example, U.S. Pat. No. 3,825,954 for "Field Effect Semiconductor Memory Apparatus With a Floating Gate" and U.S. Pat. No. 4,115,914 for "Electrically Eraseable Non-volatile Semiconductor Memory". Known techniques for selective interconnection and disconnection of programmable arrays include the use of fuseable conduction links which can be disrupted or melted by applying a surface voltage thereacross. However, the programming of fuseable links is irreverseable and results in power consumption in the semiconductor array. Additionally, a radiation beam can be used for an annealing doped polycrystal material to thereby increase the conductivity thereof, as disclosed in U.S. Pat. No. 4,233,671 entitled "Read-Only Memory And Integrated Circuit And Method Of Programming By Laser Beams". Selective masking and metalization is employed at the process level for array definition.

Copending application Ser. No. 451,823 for "Method And Structure For Selectively Interconnecting Electrical Circuit Elements" discloses a structure and method of programming which uses a predictable and selectable programming voltage. The disclosed variable resistance device utilizes a highly conductive semiconductor material having a contact surface characterized by high-resistance formed by crystal lattice disruptions or by amorphotizing the surface layer. By applying sufficient voltage across the contact surface or sufficient current through the contact surface, the crystaline structure can be altered to vary the conductance thereof.

In one aspect the present invention is directed to a complementary transistor pair having a common floating gate which allows programming of threshold voltages by hot electron injection or electron tunneling as in prior art electrically programmable transistors. The floating gate charge has opposite effects on the individual threshold voltages of the transistor pair. Since only one transistor will be turned on at any one time, before or after programming, there is no power consumption by the structure.

In another aspect of the invention the programmable complementary transistor pairs are grouped to form logic gates. The gates are programmed and inputs are enabled or disabled by the amount of charge formed on the shared floating gates of the complementary transistor pairs. In accordance with another aspect of the invention, switch devices can be provided with each transistor, either serially or in parallel, whereby selected inputs to the gates can be made ineffective. The switches may be fusible links or reversible programming devices as disclosed in co-pending application Ser. No. 451,823, supra.

Accordingly, an object of the invention is a programmable complementary transistor pair.

Another object of the invention is a gate structure which employs programmable complementary transistor pairs.

Yet another object of the invention is a gate array employing complementary CMOS transistors and variable resistive means associated with each transistor for programming the gate array.

A further object of the invention is a transistor pair and gate structure which consumes no power before or after programming.

A feature of the invention is a common floating gate in a complementary transistor pair.

The invention and objects and features thereof would be more readily apparent from the following detailed description and appended claims when taken with the drawing in which:

FIG. 1 is an electrical schematic of a programmable complementary transistor pair in accordance with one embodiment of the invention.

FIG. 2 is a section view of one embodiment of a semiconductor device shown schematically in FIG. 1.

FIG. 3 is a section view of another semiconductor device shown schematically in FIG. 1.

FIG. 4A is a section view of a programmable complementary transistor structure in accordance with another embodiment of the invention which utilizes an independent access device for programming, and FIG. 4B is a schematic thereof.

FIG. 5 is a schematic of a NOR gate using programmable complementary transistor pairs in accordance with the invention.

FIG. 6 is a schematic plan view of the NOR gate FIG. 5.

FIG. 7 is a schematic of a NAND gate using programmable complementary transistor pairs in accordance with the invention.

FIG. 8 is a schematic plan view of the NAND gate shown in FIG. 6.

FIG. 9 is a schematic of a matrix of programmable complementary transistor devices in accordance with the invention.

FIG. 10A and FIG. 10B are schematics of stepped gate transistor structures in accordance with another embodiment of the invention.

FIG. 11 is a schematic of a programmable NOR gate in accordance with another embodiment of the invention.

Referring now to the drawings, FIG. 1 is a electrical schematic of a programmable complementary transistor pair in accordance with one embodiment of the invention. The device includes a first n-channel transistor shown generally at 10 and a serially connected complementary p-channel transistor shown at 12. The source of transistor 10 is connected to a first voltage potential ($V_{ss}$) normally at ground potential and the drain of transistor 12 is connected to a positive voltage potential ($V_{dd}$). The gates of the two transistors are connected in parallel to a gate terminal 16, and the common connection of the serially connected transistors is connected to an output terminal 18. The n-channel transistor 10 can be formed by diffusing n-type source and drain regions in a p-substrate or in a p-well formed in an n-substrate, whereas transistor 12 can be formed by diffusing p-type source and drain regions in an n-substrate or in an n-well formed in a p-substrate.

In accordance with one feature of the invention the complementary transistors 10 and 12 share a common floating gate shown generally at 20. Floating gate 20 is electrically isolated from the gate contacts of the two transistors and from the channel region of the two transistors by a suitable dielectric material such as silicon oxide and silicon nitride. A portion of the floating gate 20 shown generally at 22 is separated from the source region of transistor 10 by a thin oxide which allows the tunneling of electrons. Alternately, the injection of hot electrons by suitably biasing the gate contact 16 and the substrate of p-well can be employed, in which case a thin oxide is not required. Transferring charge into or from the floating gate can proceed by hot-carrier injection by source or drain junction breakdown. Tunneling is further illustrated in FIG. 2 which is a section view of a semiconductor device illustrated schematically in FIG. 1. In this embodiment the n-channel transistor 10 is formed in a p-well 30 formed in an n-substrate 32 by the diffusion of N+ source and drain regions 34 and 36. The p-channel transistor shown generally at 12 is formed by the diffusion of P+ source and drain regions 38 and 40 directly into a surface of the N-substrate 32. Establishment of electrical charge on the common floating gate 20 is possible by suitable biasing of the N-channel transistor.

FIG. 3 is a section view of another embodiment of the invention shown schematically in FIG. 1 and is similar to the embodiment of FIG. 2 and has the same reference numerals. However, in this embodiment ion-implanted n-type dopants form a region 35 beneath the gate portion 22 in association with the N+ source 34 whereby programming of the floating gate 20 is accomplished by suitable biasing of the N+ source 34 and the gate 20 of transistor 10.

FIG. 4A is yet another embodiment of a programmable complementary transistor pair shown schematically in FIG. 1 which is similar to the embodiments of FIGS. 2 and 3, and the same reference numerals are used therewith. FIG. 4B is an electrical schematic thereof. However, in this embodiment an independent access device shown generally at 44 is used for establishing charge on the floating gate 20. The device 44 comprises an N channel transistor formed in a P well 45, the programming voltage Vp is applied to the drain of transistor 44, and the extension 22 of the floating gate is separated by thin oxide from the source region of transistor 44. Electrons can be removed from floating gate by applying the programming voltage Vp to the drain region and gating on the transistor by a suitable bias voltage Gp on the gate of device 44. Gates 16 must be biased to a low voltage for charge removal. Electrons can be applied and stored on the floating gate by biasing gate 16 to a high positive voltage, grounding the drain of transistor 44, and turning on the access device 44 by a positive voltage on Gp.

The programming of the complementary transistors results in one transistor being biased towards a conductive threshold while the other transistor is biased away from a conducting threshold. For example, establishing a negative charge on the floating gate 20 by capturing electrons thereon lowers the threshold voltage for the P channel device (sufficient negative voltage can render the transistor conductive), whereas the turn-on threshold for the N channel device is raised. Conversely, by depleting electrons from the floating gate 20 the conductor threshold of the N channel device is lowered (and the transistor rendered conductive if sufficient voltage is applied) while the threshold of the P channel device increases. This example circuit can also be viewed as a programmable transmission gate; by referring to the $V_{ss}$ and $V_{dd}$ terminals as input and output, the circuit becomes equivalent to a standard CMOS-technology transmission gate (also called analog switch), which can be electrically programmed to be in a conductive or blocking state. This is a widely used element in logic and linear circuits.

Device thresholds and capacitive coupling of the floating gate can be adjusted so that when the floating gate is neutral, the turn on voltage $V_{TN}$ of the N channel transistor is approximately plus one volt whereas the turn on voltage $V_{TP}$ of the P channel device is approximately minus one volt. In this case if the gate voltage equals zero volt, the N channel device will be off, the P channel device will be on, and the output will be pulled to $V_{dd}$. If the gate voltage equals plus five volts, and n-channel transistor becomes conductive, the P channel transistor is off, and the output will be pulled to $V_{ss}$.

By applying a high voltage pulse to the control gate, electron tunneling will occur through the thin oxide to the floating gate. This will shift the N channel device threshold to a more positive level such as 7 volts. The threshold of the P channel device, $V_{TP}$ will go to plus 5 volts because the floating gate is shared. In this case the output will be $V_{dd}$ even if the gate voltage goes up to 5 volts. Similarly, by applying a negative high voltage to the control gate, the thresholds can be shifted to, for example, $V_{TN}$ at approximate minus 3 volts and $V_{TP}$ at approximately minus 5 volts. The described programming is sufficient for memory applications. Such a memory will not consume power at either logic state since only one of the transistors will be turned on at the logic levels of zero and 5 volts (e.g. Vg equals 0 volt and Vg equals 5 volt). Thus, the circuit can be programmed to be an inverter, a fixed logic "1", or a fixed logic "0".

The programmable complementary transistor pair can be combined to implement programmable logic as illustrated in FIGS. 5–8. These figures do not show programming details, and it will be appreciated that the location of thin oxide can vary. FIG. 5 is a schematic of a logic NOR gate using two of the programmable complementary transistor pairs, and FIG. 6 is a schematic plan view of the circuit arrangement in a semiconductor structure with only voltage contacts and surface interconnections shown. For example, in FIG. 5, a first transistor pair including N channel transistor 50 and P channel transistor 52 share a common floating gate 53 with the control gates of the two transistors interconnected by line 54. The second transistor pair includes N channel transistor 55 and P channel transistor 59 having a common floating gate 57 and with interconnection 58 connecting the two control gates of the transistors. Transistors 50 and 55 are connected in parallel with the sources of the two transistors connected to $V_{ss}$ and the common source terminals connected to an output terminal 59. Transistor 51 and transistor 56 are serially connected between the $V_{dd}$ potential and the output 59. A first input, IN1, is connected to the interconnection 54 and the control gates of transistors 50 and 52. A second input, IN2, is connected to the interconnection 58 and the control gates of transistors 55 and 56. Using the programming technique described above with reference to FIGS. 1–4, the floating gates of FIG. 5 can be programed to cancel the effect of IN1 or IN2 on the logic behavior of the circuit. Additionally, the output can be locked to a ground voltage ($V_{ss}$) by having either of transistors 50, 55 biased to be conductive without regard to the input. The inputs to the NOR gate are disabled by adding electrons to the floating gate, and the inputs to the NAND gate are disabled by removing electrons from the floating gate.

FIG. 7 is a schematic of a NAND gate. The same reference numerals as in FIG. 5 are used in FIG. 7. In this embodiment the P channel transistors 52 and 56 are connected in parallel while the n-channel transistors 50 and 55 are serially connected between the output terminal and $V_{ss}$. FIG. 8 is a plan view of the circuit in a semiconductor structure. It will be appreciated that additional transistor pairs can be connected in the gate structure to provide additional inputs.

FIG. 11 is a schematic of a NAND gate similar to the schematic of FIG. 7, and like reference numerals are used for the same elements. However, in this embodiment each transistor is provided with a variable resistance device whereby either of the inputs $IN_1$ and $IN_2$ can be selectively included for excluded from the gate. Floating gates are not required in this embodiment of logic gates in accordance with the invention. The transistors 50 and 55 are shunted by resistive elements 81 and 82, respectively, and transistors 52 and 56 are connected in series with resistive elements 83 and 84, respectively. Each of the resistive elements can be a fuseable link or a programmable device as disclosed in copending application Ser. No. 451,823, supra.

Thus, to include the IN1 input in the gate, resistor 83 is shorted and resistor 81 is a high resistance. Similarly, to include IN2 in the gate, resistor 84 is shorted and resistor 82 is be a high resistance.

Programming transistors 90 and 91 are serially connected between $V_{dd}$ and $V_{ss}$ for use in programming the resistor elements 18-84. Transistor 90 is made conductive during the programming of resistors 83 and 84, and transistor 91 is made conductive during the programming of resistors 81 and 82.

Assuming that the output=IN1 is desired the programming sequence will be:

| IN1 | IN2 | NORMAL | PP | PN | NOTE |
|---|---|---|---|---|---|
| 0 | 1 | 0 | 1 | 1 | 83 is getting short |
| 1 | 0 | 0 | 0 | 0 | 82 is getting short |
| x | x | 1 | 0 | 1 | Normal operation is resumed |

During programming Vcc should be high (12 V), and during normal periods Vcc is low (0 V). A NOR gate can be provided which is similar to the NOR gate of FIG. 5.

The programmable complementary transistor pair in accordance with the invention permits programming of the relative threshold levels for the complementary transistors whereby conductive states of the two transistors are varied. The two transistors are not conductive at the same time, therefore no power is dissipated in either conductive state. The complementary transistors have applicability in logic arrays which can be readily programed for specific logic functions either by using common floating gates or variable resistances associated with the transistors.

While the invention has been described with reference to specific embodiments, the description is illustrative of the invention and is not to be construed as limiting the invention. Various modifications and applications may occur to those give the art without departing from the true spirit and scope of the invention as defined by the appended claims.

What is claimed:

1. A logic gate comprising
a first field effect transistor and a first variable resistance device connected in parallel,
a second field effect transistor and a second variable resistance device connected in parallel,
a third field effect transistor and a third variable resistance device serially connected,
a fourth field effect transistor and a fourth variable resistance device serially connected,
means connecting said third field effect transistor and said third variable resistance in parallel with said fourth field effect transistor and said fourth variable resistance thereby forming parallel circuitry,
means serially connecting said first field effect transistor, said second field effect transistor, and said parallel circuitry between first and second voltage potentials,
means for applying a first input to said first and third field effect transistors, said first and second field effect transistors being complementary,
means for applying a second input to said second and fourth field effect transistors, said second and fourth transistors being complementary, and
means for obtaining an output at the connection between said second field effect transistor and said parallel circuitry in response to said first and second inputs,
said first, second, third, and fourth variable resistance devices having a high resistance state and a low resistance state for selectively enabling said first input and said second input.

2. The logic gate as defined by claim 1 wherein said resistance devices comprise fusible links.

3. The logic gate as defined by claim 1 wherein said resistance devices comprise doped polycrystalline semiconductor material.

* * * * *

UNITED STATES PATENT AND TRADEMARK OFFICE
CERTIFICATE OF CORRECTION

PATENT NO. : 4,785,199
DATED : November 15, 1988
INVENTOR(S) : Avinoam Kolodny et al It is certified that error appears in the above-identified patent and that said Letters Patent is hereby corrected as shown below:

On the title page assignee should read:

-- (73) Assignee: Zoran Corporation, Santa Clara, Calif. --.

Signed and Sealed this

Twentieth Day of June, 1989

Attest:

DONALD J. QUIGG

Attesting Officer

Commissioner of Patents and Trademarks